United States Patent [19]

Nishida

[11] 4,226,082
[45] Oct. 7, 1980

[54] ORNAMENTAL PART FOR WATCHES AND METHOD OF PRODUCING THE SAME

[76] Inventor: Nobuo Nishida, 2-26-24, Igusa, Suginami-ku, Tokyo, Japan

[21] Appl. No.: 945,292

[22] Filed: Sep. 25, 1978

Related U.S. Application Data

[63] Continuation-in-part of Ser. No. 750,885, Dec. 15, 1976, abandoned.

[30] Foreign Application Priority Data

| Jun. 7, 1976 | [JP] | Japan | 51/66320 |
| Jun. 7, 1976 | [JP] | Japan | 51/66321 |
| Jun. 7, 1976 | [JP] | Japan | 51/66322 |
| Jun. 7, 1976 | [JP] | Japan | 51/66323 |
| Jun. 7, 1976 | [JP] | Japan | 51/66324 |
| Jun. 7, 1976 | [JP] | Japan | 51/66325 |
| Jun. 7, 1976 | [JP] | Japan | 51/66326 |
| Jun. 7, 1976 | [JP] | Japan | 51/66327 |
| Jun. 7, 1976 | [JP] | Japan | 51/66328 |
| Jun. 7, 1976 | [JP] | Japan | 51/66329 |
| Jun. 7, 1976 | [JP] | Japan | 51/66331 |
| Jun. 7, 1976 | [JP] | Japan | 51/66332 |
| Jun. 7, 1976 | [JP] | Japan | 51/66333 |
| Jun. 7, 1976 | [JP] | Japan | 51/66335 |
| Jun. 7, 1976 | [JP] | Japan | 51/66336 |

[51] Int. Cl.² .................. G04B 37/00; B05D 3/06
[52] U.S. Cl. .................. 368/285; 204/192 N; 427/38; 428/627; 428/927
[58] Field of Search .......... 427/38, 39; 58/88 R, 58/88 G; 428/627, 927; 204/192 N

[56] References Cited

U.S. PATENT DOCUMENTS

| 1,904,241 | 4/1933 | Kammerer | 428/927 |
| 3,108,900 | 10/1963 | Papp | 427/39 |
| 3,669,695 | 6/1972 | Iler et al. | 58/88 R |
| 3,684,463 | 8/1972 | Koelbl | 428/927 |
| 3,690,062 | 9/1972 | Kasai et al. | 58/88 R |
| 3,772,058 | 11/1973 | Bloom | 428/627 |
| 3,813,227 | 5/1974 | Tomita et al. | 75/205 |
| 3,841,848 | 10/1974 | Kasai et al. | 428/927 |
| 3,900,592 | 8/1975 | Kennedy et al. | 427/39 |
| 3,953,178 | 4/1976 | Engel | 428/627 |

FOREIGN PATENT DOCUMENTS

| 2410483 | 9/1974 | Fed. Rep. of Germany | 427/39 |
| 339575 | 8/1959 | Switzerland | 428/622 |

Primary Examiner—John H. Newsome
Attorney, Agent, or Firm—Sherman & Shalloway

[57] ABSTRACT

An ornamental part for watches such as a watch case having a composite coating layer consisting essentially of titanium and titanium nitride, the ratio of the two components being varied in the direction of the thickness of the layer. The composite coating may be formed by the physical vapor deposition method in which the titanium in the vapor phase is reacted with nitrogen under a glow-discharge condition. The coating thus formed has a gold color and excellent physical and chemical properties.

20 Claims, 15 Drawing Figures

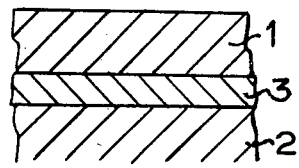
FIG. I (PRIOR ART)
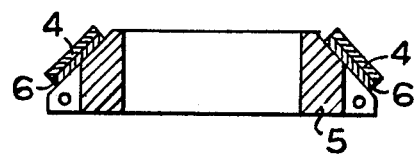
FIG. 2 (PRIOR ART)
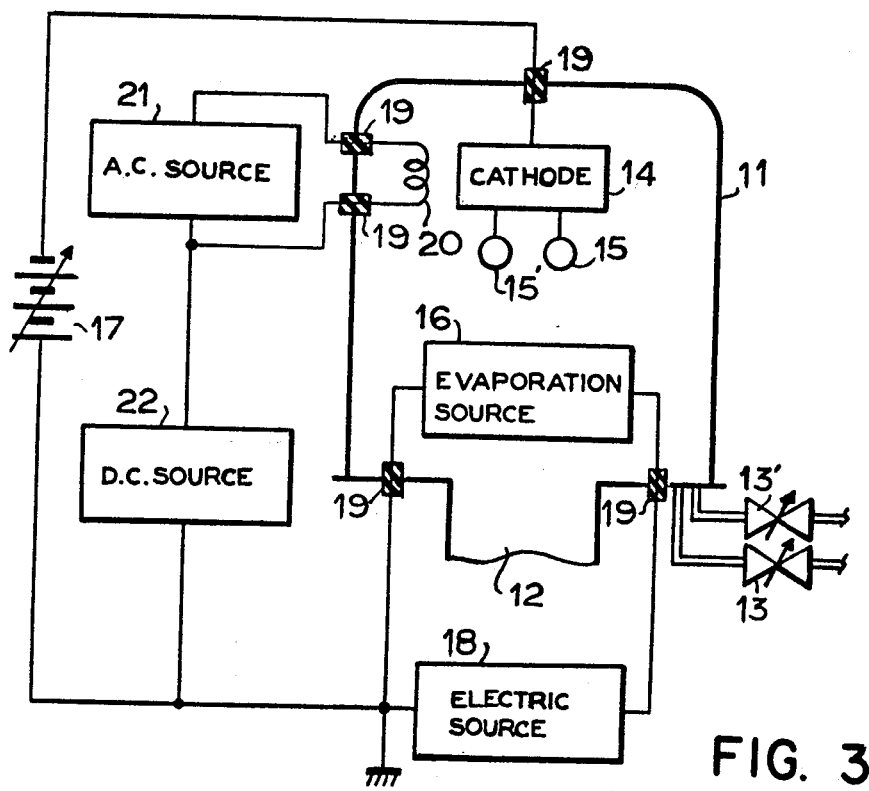
FIG. 3

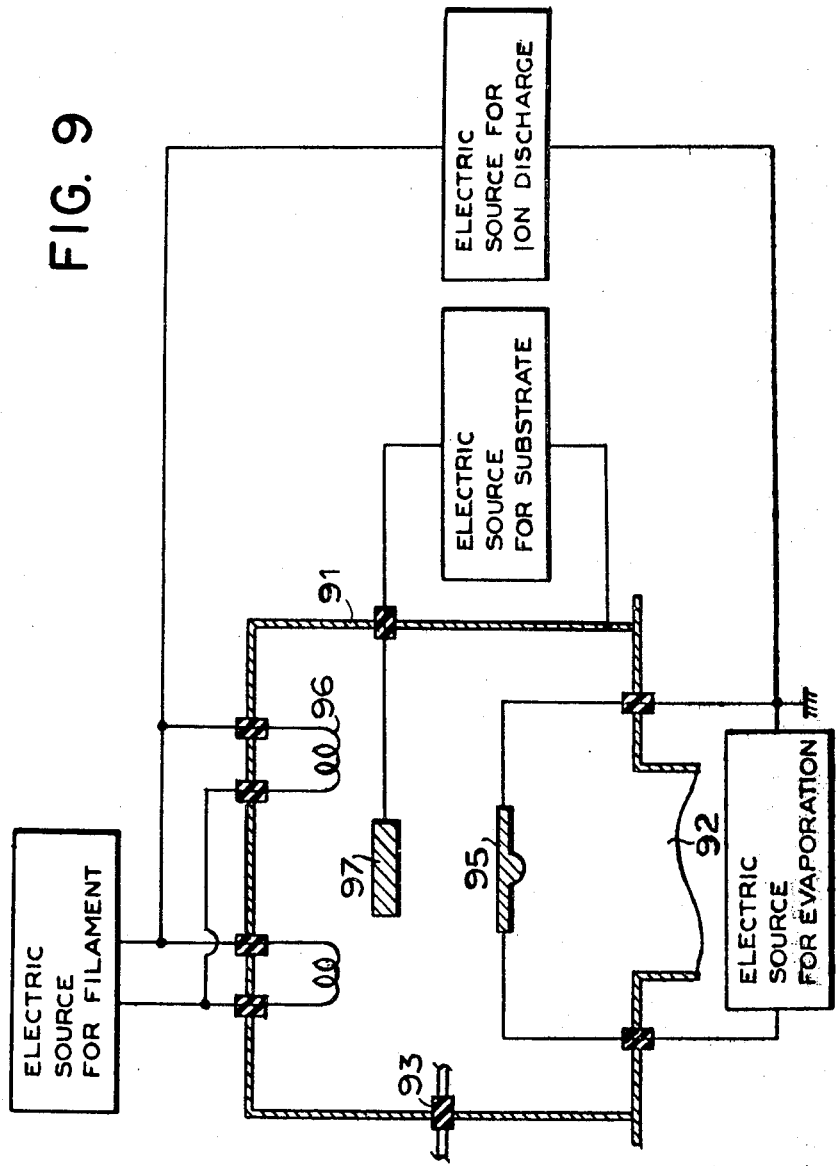

ORNAMENTAL PART FOR WATCHES AND METHOD OF PRODUCING THE SAME

BACKGROUND OF THE INVENTION

This is a continuation-in-part application of the application of Ser. No. 750,885 filed on Dec. 15, 1976, now abandoned.

FIELD OF THE INVENTION

This invention relates to an ornamental part for watches having a coating formed on the surface of a substrate in order to improve the appearance on the surface of the substrate and to impart excellent physical and chemical properties to the surface of the substrate. The invention further relates to a method of producing such ornamental parts.

PRIOR ART

Substrates of ornamental parts used for watches which are mass-produced on an industrial scale, are largely made of a stainless steel or a brass. Ornamental parts of gold color are obtained by forming a coating of gold on the surfaces of substrates made of a stainless steel or a brass by way of a customarily employed technique of plating. Gold, however, has a small degree of hardness and is susceptible to scars markedly losing its initial appearance after the use of short periods of time.

It was so far widely attempted to use the titanium nitride having high degree of hardness and resistance against corrosion as a coating for protecting the surfaces of materials having poor hardness. For example, U.S. Pat. No. 3,772,058 issued to Bloom teaches the art of forming a coating of titanium nitride on the surfaces of the turbine blades by means of a chemical vapor deposition method (CVD method). According to this prior art, the titanium nitride coating is formed on the surfaces of a substrate heated at about 550 to 750° C. by depositing the titanium nitride by the thermal reaction. The formation of coating by the thermal reaction, however, is not much suited for the ornamental parts for watches. The reason is because since the titanium nitride has small chemical reactivity for the surfaces of substrates, the coating is not intimately and firmly adhered to the surfaces of the substrates unless some pretreatment is effected, such as removing the layer of oxide which is present on the surfaces of the substrate prior to forming the coating, or forming a coating of a metal which may form an easily reducing oxide on the surfaces of the substrate.

FIG. 1 is a cross-sectional view showing a portion of a turbine blade having on the surface of a substrate 2 a coating 1 composed of the titanium nitride formed by the CVD method. In order to obtain firm bonding between the titanium nitride coating 1 and the substrate 2, it is necessary to provide an intermediate layer 3 of gold on the surface of the substrate 1 by the technique of, for example, vacuum vapor deposition. In this case, however, the oxide on the surface of the intermediate layer 3 must be removed prior to forming the titanium nitride coating 1.

On the other hand, it was so far attempted to use the titanium nitride for the ornamental parts for watches because of its high degree of hardness, resistance against corrosion and its exhibition of gold color when viewed from the surface thereof. These attempts were all based on the art of powder metallurgy. U.S. Pat. No. 3,669,695 issued to Iler et al discloses the use of the fine particles (particle sizes ranging up to 2 microns) of titanium nitride, tungsten, nickel, chromium, iron and molybdenum, and U.S. Pat. No. 3,841,848 issued to Kasai et al discloses the use of powders of titanium nitride, manganese, aluminum, vanadium and titanium. Components other than the titanium nitride are chiefly used as binders. Irrespective of whether they are totally composed of a sintered product of titanium nitride or they are of a structure that is to be mounted on other substrates, the parts obtained by such methods have rugged surfaces with numerous dents of a depth of a maximum of about 50 microns which are specific to the sintered products. In many cases, therefore, the parts obtained by such methods must be polished using a diamond powder.

FIG. 2 shows a case of a watch in which a ring 4 composed of a sintered product of titanium nitride is so mounted as to cover part of the surface of a substrate 5 of the watch case. In this case, the titanium nitride ring 4 must be adhered onto the substrate 5 by means of an adhesive layer 6 or it must be mounted on the substrate 5 using a snap ring, causing the manufacturing cost to be increased and restricting the freedom in designing the watch case.

The abovementioned defects can be eliminated if it is allowed to form the coating of titanium nitride directly on the surface of the substrate of the watch case. However, by whichever way of the CVD method or the sintering method the coating may be formed, the substrate must be heated at such a high temperature as about 550° C. to 1800° C., whereby the materials of the substrate are limited to those having great resistance against heat. Further, even if a material capable of withstanding the temperature during the vaporization or sintering were selected, the resulting substrate will invite deformation such as warping and dimensional change after heated for long periods of time.

SUMMARY OF THE INVENTION

This invention provides ornamental parts for watches having a coating of titanium nitride formed on the surfaces of a substrate made of a stainless steel or a brass by the method of physical vapor deposition effected under the conditions that will be mentioned later in detail.

The physical vapor deposition (PVD) methods have nowadays been extensibly used for forming the coatings, and among them the technique of reactive ion plating has seen a remarkable progress. This technique of plating makes a considerable difference from the conventional vaporization based on the thermal reaction in regard to that a gaseous reactant introduced into a vacuum vessel and another reactant evaporated from the source of evaporation are ionized by the glow discharge, activated and reacted together, such that the reaction product which is a compound of the two reactants is deposited on the surfaces of the substrate placed in the vacuum vessel.

Therefore, it is an object of this invention to provide an ornamental part for watches having a coating layer of titanium nitride which is capable of being formed on the surface of a body of the part without utilizing a special pretreatment such as an oxidation or reduction treatment to the surface of the body and a precoating process.

Another object of this invention is to provide an ornamental part for watches having a TiN coating layer on a body consisting of a metal or an alloy which is conventionally utilized material such as stainless steel, brass, ceramics and plastics.

A further object of this invention is to provide a method of producing an ornamental part for watches having a lustrous TiN coating layer without secondary working such as polishing after it has been formed.

A still further object of this invention is to provide a method of producing an ornamental part for watches having a TiN coating layer having a gold color close to that of pure gold or gold alloy at a reduced production cost.

A yet further object of this invention is to provide a method of producing an ornamental part in which a body is prevented from being deformed and varied in size during a step of forming a TiN coating layer thereon.

BRIEF DESCRIPTION OF THE DRAWINGS

FIG. 1 is a vertical cross-sectional view showing on an enlarged scale a portion of a turbine blade having a titanium nitride coating formed by a conventional CVD method;

FIG. 2 is a vertical cross-sectional view of a watch case having a sintered titanium nitride ring;

FIG. 3 is a schematic diagram of an ion plating apparatus suited for practicing the method of this invention;

FIG. 9 is a diagrammatic sectional view showing an improved multiple cathode type ion plating apparatus practicing the invention;

DESCRIPTION OF THE PREFERRED EMBODIMENTS

Figure 4:
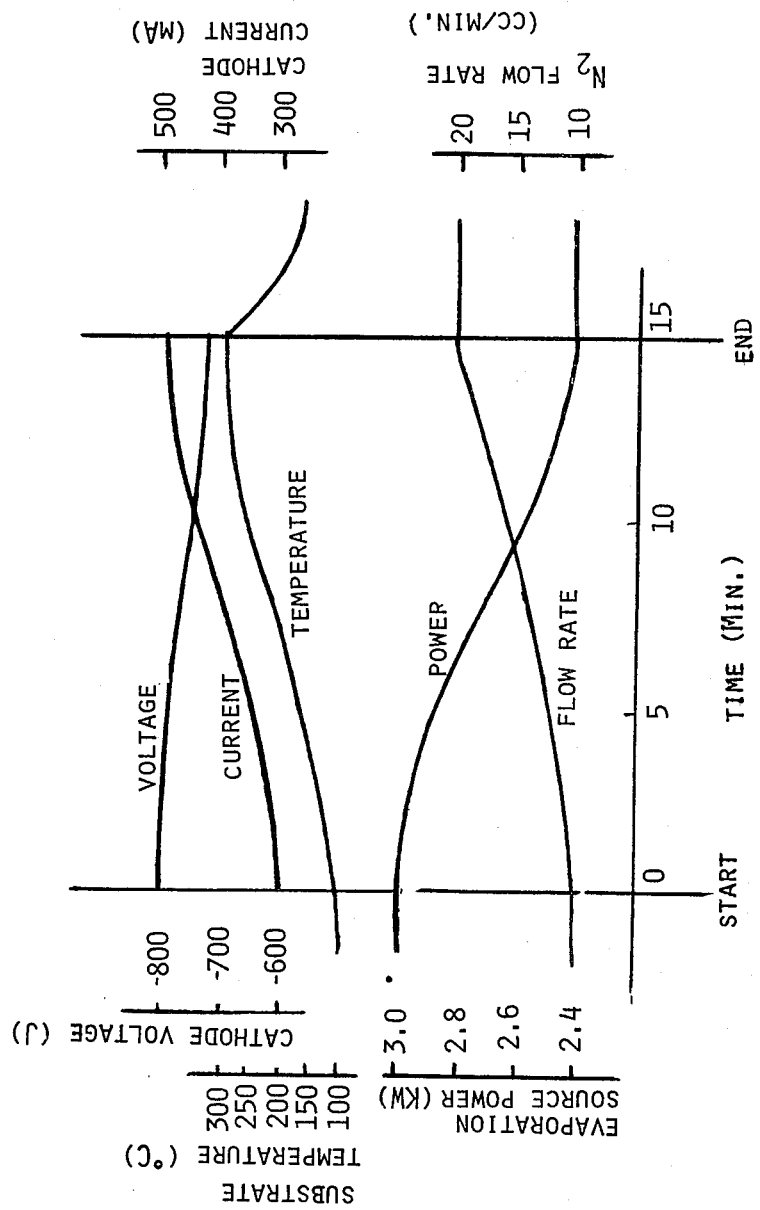
FIG. 4 is a graph showing the change in power consumption by the source of evaporation, temperature of the substrate, cathode voltage, cathode current and flowing rate of nitrogen with respect to the time of the ion plating according to this invention.

Referring to FIG. 3 showing the ion plating apparatus suited for forming the titanium nitride coating of this invention, the interior of a vacuum vessel 11 having an exhaust conduit 12 is exhausted to a pressure of, for example, $5 \times 10^{-5}$ Torr by a vacuum pump which is not shown here. The nitrogen gas is then introduced into the vacuum vessel 11 through a line having a needle valve 13, such that the pressure in the vacuum vessel is maintained at about $2 \times 10^{-2}$ Torr. Reference numeral 13' represents a needle valve that will be used when an inert gas is to be introduced, as required, into the vacuum vessel 11.

The vacuum vessel 11 accommodates substrates 15 and 15' on which will be formed the titanium nitride coating, which are electrically connected to a cathode 14, and an evaporation source 16 disposed underneath the substrates 15 and 15'. In this embodiment, the substrate 15 is a watch case made of aluminum and the substrate 15' is a strap made of brass and a watch case made of stainless steel (SUS 304), which have been washed beforehand with a neutral detergent or alcohol and degreased. The evaporation source 16 consists of a container for containing the powder of titanium and a heater for heating the powder of titanium, and heater is served with an electric current from a power source 18. A predetermined d-c voltage is applied across the cathode 14 and the evaporation source 16 from a d-c power source 17.

A filament 20 disposed adjacent to the cathode 14 is biased to $-500$ volts by a d-c power source 22 and receives the electric current of 5 amperes from an a-c power source 21. The insulating and sealing members designated at 19 are to seal the gap between the vacuum vessel 11 and the electric wires connected to the cathode 14, evaporation source 16 and filament 20.

The ion plating is carried out by supplying the nitrogen gas at a predetermined flow rate into the vacuum vessel 11, heating the cathode 14 by the filament 20, further heating the substrates 15, 15' as required, and heating the evaporation source 16 to produce the vapor of titanium. When titanium is evaporated from the evaporation source 16 at a rate of about 0.7 per minute, there will be observed a bluish light of glow discharge specific to titanium heading from the evaporation source 16 toward the substrates 15 and 15'.

The glow discharge developed between the evaporation source 16 and the substrates 15, 15' ionizes the nitrogen gas present in the vacuum vessel according to the following formula

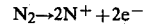

The thus produced ions and electrons excite and ionize the titanium atoms emitted from the evaporation source 16.

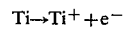

These ions $N^+$ and $Ti^+$ are accelerated toward the substrates 15 and 15' having negative potential. These ions have extremely great chemical activity as compared to the electrically neutral nitrogen molecules or titanium atoms, and exhibit great bonding force with respect to the metal of the substrate when they arrived at the surface of the substrate. This can be proved by the fact that the titanium nitride coating was formed being strongly bonded to the surface of the substrate even when the temperature of the substrate was 300° C. or less, which was such a low temperature that could not be implied from the conventional nitriding reaction.

The structure of titanium nitride in the coating formed on the substrate is represented by TiNx, wherein the parameter which determines the value of x is dependent upon the ionization degree of nitrogen and titanium, i.e., dependent upon the degree by which nitrogen and titanium are activated, and the magnitude of acceleration energy imparted to the formed ions. In other words, it is possible to arbitrarily change the value of x over a range of from zero to 1 by varying the current of glow discharge and the potential difference between the substrates and the evaporation source. Moreover, the ratio of titanium nitride to pure titanium in the foamed coating is determined by the ratio of the partial pressure of nitrogen gas to the partial pressure of titanium vapor in the vacuum vessel. A particular advantage of this invention is that the formation of the coating is not almost impaired by the presence of oxides on the surface of the substrate.

In carrying out the ion plating for about 15 minutes from the time the glow discharge has took place, the rate of introducing the nitrogen gas, the rate of power consumption by the heater of the evaporation source, the cathode voltage and the cathode current were varied as shown in FIG. 4. The temperature of the substrate during this period was also measured by means of an alumel-chromel thermocouple to obtain the results as shown in FIG. 4. The resulting coating exhibited a thickness of about 1.2 microns and a whitish gold color, and its degree of luster was equal to that of the substrate surface as measured by a glossmeter.

Figure 5:
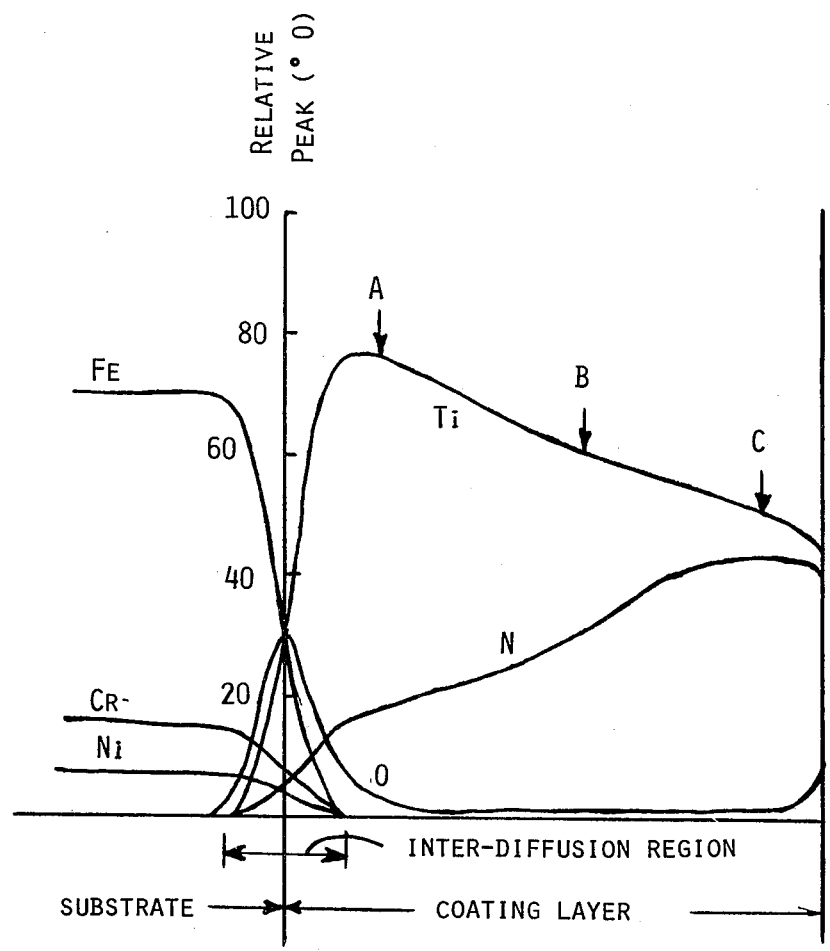
FIG. 5 is a graph showing the composition of components in the direction of thickness of the titanium nitride coating formed by the ion plating of the present invention.

FIG. 5 shows the change in composition of components in the direction of thickness of the coating layer formed on a stainless steel substrate by the ion plating performed under the conditions shown in FIG. 4. This composition is given by the AES analysis and the XMA analysis which are generally employed in this field of art. As will be obvious from FIG. 5, on the layer of substrate metal are formed a layer of oxide of the substrate metal and the coating layer in the order mentioned, and an inter-diffusion region is formed in a boundary portion from the layer of oxide toward the coating layer placed thereabove. Such an inter-diffusion region will not be formed by the conventional vaporization method based on the thermal energy. The thickness of the inter-diffusion region varies depending upon the migrating speed of ions, i.e., depending upon the potential difference between the substrate and the evaporation source. The thickness of the inter-diffusion region increases with increase of the potential difference. Attention, however, should be given to that if the acceleration voltage exceeds 3 kilovolts, the surface of the substrate is appreciably roughened; therefore, the acceleration voltage should be set at an optimum value. It was also found that the thickness of the inter-diffusion layer undergoes the change depending upon the heat treatment after the coating layer has been formed. From the results of the X-ray diffraction analysis, it was confirmed that the ratio of titanium nitride contained in the coating layer was about 3 to 1 on the basis of weight at a portion closest to the substrate and about 1 to 5 at a portion closest to the outermost surface, the ratio being continuously changed therebetween.

Using the apparatus shown in FIG. 3, three samples A, B and C were prepared under such conditions that the compositions corresponding to the points A, B and C of FIG. 5 were obtained. The substrates used were made of stainless steel (SUS 304, Hv = 250), and the coating layers of a thickness of about 5 microns were formed on their surfaces.

From the results of X-ray diffraction, it was clarified that each sample was mainly composed of titanium nitride and titanium, the crystalline particles of the titanium nitride being very small having an average particle diameter of 150 angstroms, and the individual crystalline particles having the highest peak at (200) orientation. The reasons why such crystals are formed can be attributed to a low temperature on the surface of the substrate and the bombardment of the accelerated ions which restrain the growth of crystals. Only when the individual titanium nitride crystals acquired the highest peak at the highest peak at (200) orientation, smoothness comparable to that of the surface of the substrate is reproduced on the surface of the coating layer, eliminating the need of polishing the surface of the coating layer.

The coating layers of the samples A, B and C exhibited the hardnesses of Hv 500, 1000 and 1500, respectively. This indicates that the content of TiN in the coating layers formed by this invention gradually increases from the portion closest to the substrate toward the outermost surface. When the samples A, B and C were subjected to the 90-degree bending test, no peeling of the coating layer was developed on the samples A and B, but the peeling developed on the sample C.

The above samples A, B and C were subjected to continuous spray of a 5% NaCl aqueous solution at 35° C. for 96 hours. As a result, the sample C exhibited to change on the surface, but the surfaces of the coating layers of the samples A and B had been corroded to a degree that could be recognized by naked eyes.

The results of the tests revealed that the coating layers of the samples A and B exhibited good adhesion to the substrates and excellent conformability to the bending but poor hardness and resistance against corrosion, whereas the sample C exhibited the tendency contrary to the above samples. The sample A has a composition corresponding to a portion of the coating layer closest to the substrate of this invention, the sample C has a composition corresponding to a portion closest to the outer surface of the coating layer, and the sample B has a composition corresponding to a middle portion of the coating layer. It wll therefore be comprehended that the coating layer formed according to this invention exhibits good adhesiveness to the substrate as well as resistance against corrosion and scratch on the surface.

According to the method of this invention by which the coating layers are formed by a batch system, it is difficult to prevent some conditions from being slightly changed for each lot; the change in conditions presents slight change in color of the resulting coating layers. The variation in color, however, can be removed by heating the thus formed coating layers at a temperature of about 250° C. to about 600° C. for 30 minutes to 90 minutes in vacuum or in a nitrogen gas.

The coating layer having the best luster can be obtained when the thickness is smaller than about 2 microns, preferably smaller than about 1 micron. When the coating layer of a thickness within the abovesaid range is formed, there is no need of polishing the surface to improve the luster. Examples of the materials for making the substrate may be a ferro-alloy containing stainless steel, aluminum and aluminum alloy, brass and a copper alloy containing nickel silver, plastics and ceramics. Another coating may have been formed beforehand on the surface of the substrate.

The ratio of titanium nitride to titanium contained in the coating layer is one of the elements for determining the corrosion resistance of the coating layer; the corrosion resistance decreases with the increase of the titanium content. The corrosion resistance of the coating layer having large titanium content can be greatly improved by bringing a liquid containing one or two or more of hydrochloric acid, sulfuric acid and fluoric acid into contact with the coating layer, and then bringing a treating liquid containing chromic acid into contact with the coating layer. Owing to the abovementioned treatment, the coating layer having a composition in which the ratio of titanium nitride to titanium ranges as widely as from 100:1 through up to 1:100 on the basis of weight, is allowed to be applied to the ornamental parts for watches thereby exhibiting necessary resistance against corrosion. Therefore, the coating layers prepared according to this invention can be applied to various articles such as pens, frames of spectacles, necktie pins, fittings, buttons and the like, in addition to the ornamental parts for watches.

Although the embodiment shown in FIG. 3 employed an ion plating apparatus for forming the titanium nitride-titanium composite layer, any ion plating apparatus can be effectively used, such as multi-cathode system, radio-frequency excitation system and thermionic excitation system. It is also allowable to use a sputtering apparatus. Whichever apparatus may be employed, it is allowable to use a nitrogen-containing compound such as $NH_3$ as a source of supplying nitrogen ions instead of the nitrogen gas, as well as to use inert gases such as argon, neon, krypton and the like.

Figure 6:
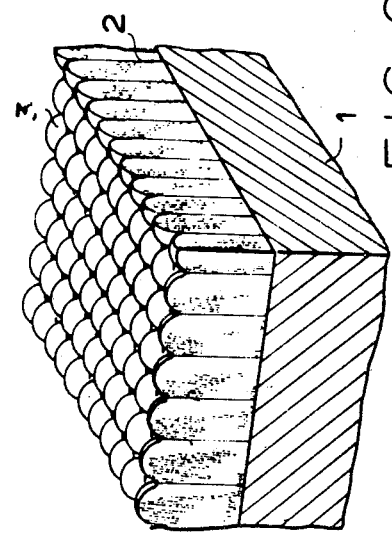
FIG. 6 is an enlarged perspective view showing partly in section a stainless steel substrate covered with a titanium nitride coating produced by a conventional reactive ion plating.

In FIG. 6 is shown in section a stainless steel substrate 121 covered with a titanium nitride coating 122 produced by conventional reactive ion plating. The coating 122 is of a column-shaped structure whose surface 123 becomes somewhat roughened. The coating 122 is formed by evaporating titanium at a slow speed, by applying to the substrate a voltage higher than $-1$ KV and by heating the substrate 121 a a temperature higher than 300° C. The coating is orange in color tone due to progress in crystallization, has a rough surface due to the presence of large crystals is dark in color tone owing to small reflection and is difficult to wipe off its contamination.

Figure 7:
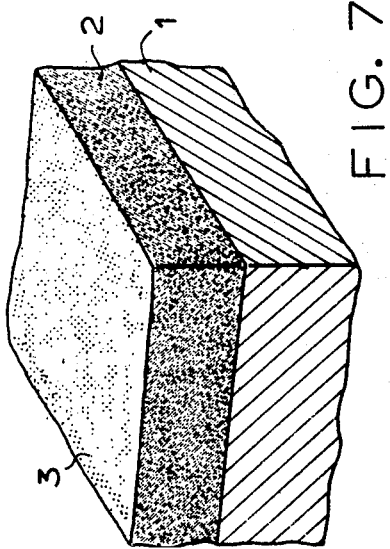
FIG. 7 is an enlarged perspective view showing partly in section a stainless steel substrate covered with a titanium nitride coating according to the invention.

In FIG. 7 is shown in section a stainless steel substrate 121 covered with a titanium nitride coating 122 produced according to the invention. In accordance with the invention, the coating is formed by taking the following ion plating conditions into consideration. That is, the substrate is not heated so high that the substrate temperature is kept within a range not exceeding 300° C. when the coating is formed. The voltage applied to the substrate is limited to a value lower than $-500$ V. The coating forming speed is 0.05 $\mu$/min. As seen from FIG. 7, the column-shaped structure is disappeared from the coating. The surface 123 of the coating is composed of very fine particles and hence is flat and smooth. The use of the above mentioned ion plating conditions provides the important advantage that nitrogenization of titanium is somewhat constrained to make the coating is composed of particles whose particle diameter is smaller than 150 Å, that the flat and smooth surface results in an improved reflective power thus providing a coating which is bright yellow, that polycrystal involves a relatively small internal stress, and that the coating has a thickness of about 2 $\mu$ and a hardness of Hv 2,000.

Figure 8:
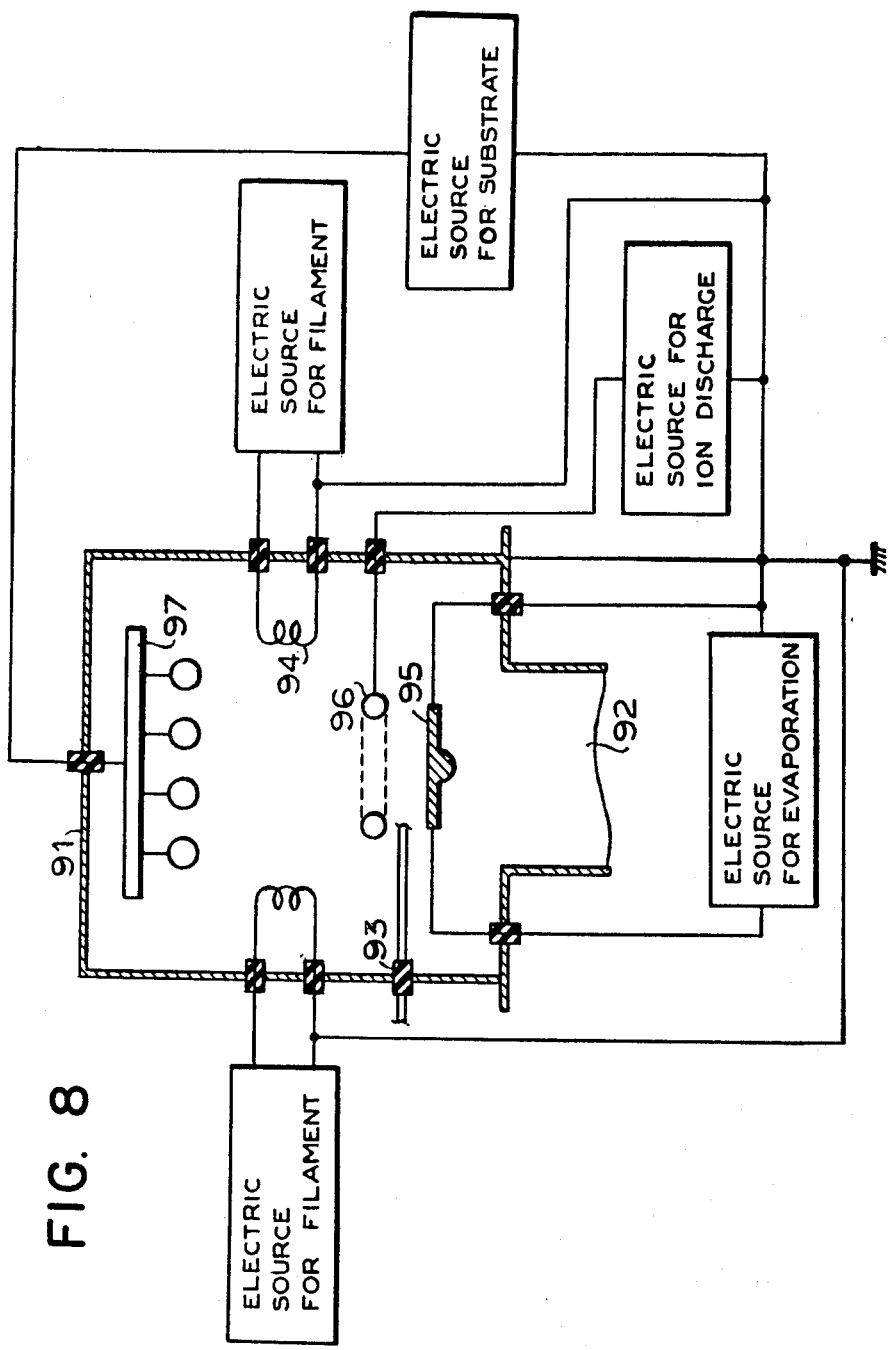
FIG. 8 is a diagrammatic sectional view showing a hot cathode discharge type ion plating apparatus practicing the invention.

In FIG. 8 is shown a hot cathode discharge type ion plating apparatus practicing the invention. A vacuum chamber 91 is evacuated through an exhaust pipe 92 and then a nitrogen gas is introduced through an inlet pipe 93 into the vacuum chamber 1 to maintain a reduced pressure of $1 \times 10^{-3}$ Torr. A hot cathode 94 and its electric source F as well as an anode 96 and is electric source A are operated to generate hot cathode discharge plasma in the vacuum chamber 91. To a substrate 97 composed of a stainless steel watch case formed of SUS 304 material is applied a voltage of $-150$ V. Then, an evaporation source 95 and its electric source are operated to evaporate Ti at a speed of 20 Å/sec for about 30 minutes thus effecting reactive ion plating.

The watch case constituting the substrate revealed a light golden color corresponding to a noble yellow color. The substrate was resistant against corrosion resistance tests inclusive of salt water spray for 48 hours and sweat immersion for 48 hours. The sample was also resistant against heat cycle test in which it is cooled from 300° C. to room temperature repeating 20 times. Even when the watch case was deformed by bending it by an angle of about 15°, the watch case showed no cracks and flake off. The noble yellow color coating having a thickness of 30$\mu$ had a hardness of 1080 MHV. A weight ratio of titanium to titanium nitride was 4:6.

In the present test, use is made of hot cathode discharge type reactive ion plating apparatus as shown in FIG. 3. In this apparatus, it is possible to obtain a composite coating consisting of titanium and titanium nitride by making the amount of the nitrogen gas constituting one of reaction carries and introduced into the vacuum vessel small and by making the concentration of the evaporation particles of titanium constituting the other reaction carrier high under constant strength of discharge plasma and constant vacuum conditions. A ratio of titanium to titanium nitride may be changed from 1:100 to 100:1 by increasing or decreasing the concentration of the evaporating titanium particles, that is the evaportion speed of titanium.

In general, if the ratio of titanium to titanium nitride is changed, the mixture consisting of titanium and titanium nitride approaches in its property to each of titanium and titanium nitride. For example, if the coating contains much amount of titanium, the coating is excellent in toughness and its color tone is changed from noble golden color into white color. On the one hand, if the coating contains much amount of titanium nitride, the coating becomes brittle and its color tone is changed from noble golden color into dark golden color. In the present invention it is preferable that a ratio of titanium to titanium nitride is 3:1 to 2:10.

In the present example, the thickness of the coating is 30$\mu$, but it is possible to produce coatings whose thicknesses vary within a wide range between 0.2$\mu$ and 100$\mu$. A coating having a thickness of 30$\mu$ shows a hardness of 1080 MHV and can be deformed by bending it by an angle of about 15°.

In the present example, the watch case is composed of stainless steel formed of SUS 304 material. The invention may also be applied to austenite system stainless steels having excellent corrosion resistance. In addition, the invention may be applied copper alloy having inferior corrosion resistance and all of metals, alloys and non-metals having good adherence and heat resistance.

The ornamental part according to the invention has light noble golden color which has been difficult to be obtained by gold electroplating and also has excellent corrosion resistance. The thick ornamental part provides a superhard ornamental part which may be applied not only to ornamental fields but also to any other fields.

Figure 12A:
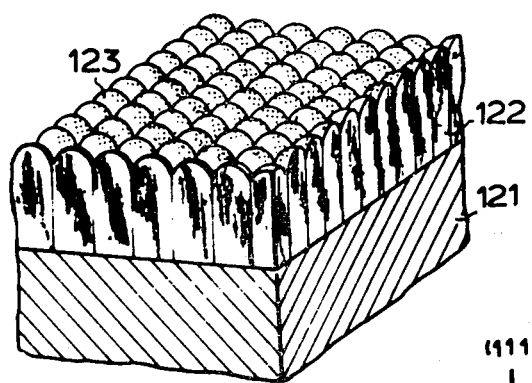
FIG. 12A is an enlarged perspective view showing partly in section a conventional titanium nitride coating formed on a stainless steel substrate.
Figure 12B:
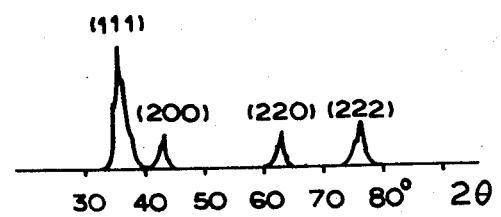
FIG. 12B is a graph illustrating the X-ray diffraction pattern of the coating shown in FIG. 12A.

In FIGS. 12A and 12B are shown characteristics of a conventional titanium nitride coating produced by reactive ion plating. As seen from FIG. 12A showing a titanium nitride coating 122 formed on stainless steel substrate 121, the coating 122 is column-shaped structure in section whose upper ends 123 are protruded and roughened. FIG. 12B shows X-ray diffraction pattern in which (111) and (222) have preferential orientation.

Figure 13A:
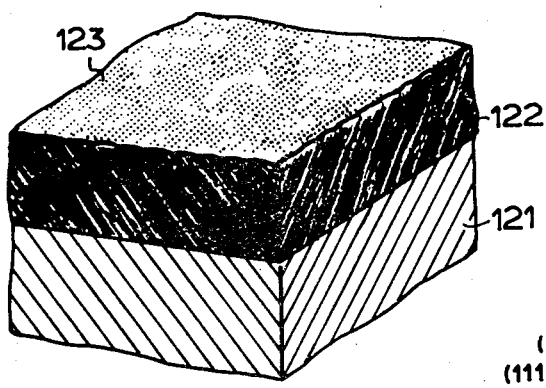
FIG. 13A is an enlarged perspective view showing partly in section a titanium nitride coating formed on a stainless steel substrate according to the invention.
Figure 13B:
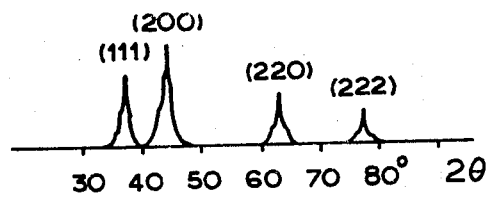
FIG. 13B is a graph illustrating X-ray diffraction of the coating shown in FIG. 13A.

In FIGS. 13A and 13B are shown characteristics of a titanium nitride coating according to the invention. As seen from FIG. 13A showing in section a titanium nitride coating 122 formed on a stainless steel substreate 121, the column-shaped structure of the coating is disappeared and the coating 122 shown substantially bulk-shaped structure whose surface 123 is composed of fine particles and flat and smooth. FIG. 13B shows X-ray pattern in which (200) orientation has the highest peak and the other (111), (220) and (222) orientations are also present.

As described above, a conventional titanium nitride coating having a thickness of about 5μ has a hardness of about 500 Hv. contamination adhered to such coating could not be wiped off thus changing its color tone. On the contrary, the titanium nitride coating according to the invent on having the same thickness as of about 5μ has a hardness within a range between 1,500 Hv and 3,000 Hv. Contamination adhered to the coating can easily be wiped off.

In the case of producing the coating according to the present invention by ion plating, it is most important to limit the temperature rise of the substrate during formation of the coating to a temperature lower than 300° C. For this purpose, a thermocouple is arranged near the substrate so as to check the temperature of the substrate.

In accordance with the invention, a yellow titanium nitride coating having a thickness of about 3.4μ was formed on two watch cases; each formed of stainless steel material (SUS 304) and on one stainless steel plate by reactive ion plating.

This watch case had a fine surface and contamination adhered thereto could easily be wiped off. The watch case had a surface hardness of 2,000 Hv under 25 g load. Salt water spray test effected at 35° C. for 96 hours and sweat immersion test effected at 35° C. for 96 hours have yielded the result that more or less rust is present on the coating and that the coating is not flaked off the substrate and hence firmly adhered thereto.

A stainless plate (2 cm×2.5 cm×0.05 cm) covered with a titanium nitride coating was tested by U.S. Taber Co. abrasion testing machine, CS-10 grinding wheel, covered with rubberized fine grinding particles under 500 g load. The tests over 1,000 times showed that no scratches occur on the coating.

As described above, the coating having (200) preferential orientation and the other (111), (220), (222), etc. orientations and formed on stainless steel substrate has an excellent adherence, appearance, corrosion resistance and wear resistance.

The invention is capable of practically using a stainless steel ornamental part covered with titanium nitride coating and providing a novel ornamental material which may widely be used in various fields.

The invention will now be described with reference to practical examples.

EXAMPLE 1

Ferrite system stainless steel mainly consisting of 28.50 wt. % of Cr, 0.87 wt. % of Si, 1.18 wt. % of Mn, 0.023 wt. % of C and the remainder of Fe was used to manufacture a watch case whose surface was ground. A titanium nitride coating having a thickness of about 1μ was formed on the watch case by reactive ion plating under the following treating conditions.

Evaporation: Electron beam heating
Material to be evaporated: 99.9% Ti powder
Atmosphere: $N_2$ gas $8 \times 10^{-3}$ Torr
Voltage applied between electrodes: 1.0 KV negative direct current voltage
Treating time: about 40 minutes.

The coating produced was light yellow in color and had a Vickers hardness of about 1000 and excellent scratch resistance. Salt water spray test effected at 35° C. for 96 hours by using 5% salt water yielded the result that no discoloration due to rust etc. occurred. Sweat immersion test effected for a period longer than one week has yielded the result that no discoloration occurs and that no change in appearance and quality of the coating occurs thereby providing a satisfactory watch case.

Influence of magnetic field exerted to a complete watch comprising a gear mechanism incorporated therein and a watch case treated according to the invention was compared with that of the same complete conventional watch comprising a watch case formed of austenite system stainless steel SUS 304. This comparison test yielded the result that the conventional watch comprising the watch case formed of SUS 304 was stopped when magnetic field applied becomes 20 oe. On the contrary, the watch treated according to the invention can withstand a high magnetic field of 50 oe. The watch whose case and rear lid are treated according to the invention can withstand a magnetic field of higher than 80 oe. Thus, the invention provides an ornamental part which can improve precision of electronic watches.

In the above example, use is made of ferrite system stainless steel containing 28% of Cr. The same result may be obtained by using ferrite system stainless steel comprising 13.0% to 34% of Cr, less than 1.0% of SI, less than 1.0% of Mn, less than 4% of at least one metal selected from the group consisting of Mo, W, Ta, Ce, Ge and Nb and 0.2 to 4% of at least one metal selected from the group consisting of V, Ti, Al and Si and by producing on an ornamental part for watch formed of such stainless steel a titanium nitride coating by reactive ion plating.

As described above, the invention provides an epoch-making ornamental part for watches which is light yellow in color tone and hence function to satisfy ornamental purpose and which causes an electronic watch to improve its precision.

EXAMPLE 2

A plate having a size of 10 mm width×20 mm length×0.5 mm thickness and formed of SUS 303 material was sufficiently cleaned with acetone. The substrate was subjected to ion platings each of which was effected by changing the amount of nitrogen gas from 1 ml/min. to 30 ml/min. The result measured by unicolor difference system (U.C.S.) is shown in the following Table 1.

TABLE 1

| Sample No. | Amount of N₂ Gas | Values measured by U.C.S. | | | |
|---|---|---|---|---|---|
| | | L | a | b | Color Tone (Visible) |
| 1 | 1 ml/min. | 16.3 | −3.4 | +0.7 | Super Light Yellow |
| 2 | 3 ml/min. | 15.8 | −1.4 | +1.0 | Light Yellow |
| 3 | 5 ml/min. | 17.9 | +0.7 | +2.5 | Light Yellow (Slightly Dark) |
| 4 | 10 ml/min. | 20.8 | +2.0 | +4.1 | Light Yellow (More Darker) |
| 5 | 20 ml/min. | 19.9 | +2.5 | +4.9 | Yellow (18K Color) |
| 6 | 30 ml/min. | 19.3 | +2.0 | +6.6 | Yellow (24K Color) |

Note:
L is brightness value, a is a degree of red and green colors and b is a degree of yellow color. The values are measured by an apparatus manufactured and sold by Nippon Denshoku Kogyo K.K. in the trade name of Type ND-3030. For comparison sake, L, a and b for 18K, 24K and 65/35 brass were also measured whose result is shown in the following Table.

| | L | a | b |
|---|---|---|---|
| 18K | 20.1 | +2.3 | +5.0 |
| 24K | 19.4 | +2.1 | +7.1 |
| 65/35 brass | 18.2 | +1.3 | +5.7 |

Analysis effected on each of the samples shown in Table 1 yielded the result that a rate of nitrogenization corresponds to the color tone and that the higher the rate of nitrogenization the more intense the golden color.

An absolute value of the amount of nitrogen gas to be supplid when the ion plating is effected must be changed in accordance with oin plating apparatuses used.

If the brightness value L is smaller than 10, the coating becomes dark color and its chemical resistance is considerably degraded. If the brightness value L is larger than 22, the coating becomes brittle and is liable to be easily flaked off the substrate, so that such coating could not be used as an ornamental part for watches.

If the degree a of the red and green colors is smaller than −5, green color becomes strong. If the degree of a of the red and green colors is larger than +5, red brown becomes strong and approaches to that color of a part which is appeared when the part is sintered and which cannot be used instead of the color tone of gold and its alloy.

If the degree b of the yellow color is smaller than 0, yellow tone becomes extremely light. If the degree b of the yellow color is larger than 5, the coating is liable to be flaked off the substrate and cannot be used instead of the color tone of gold and its alloy and hence cannot be used as an ornamental part for watches.

As seen from the above, a titanium nitride coating which satisfies conditions that L=10 to 22, a=−5 to +5 and b=0 to +5 has excellent adherence to a substrate and good color tone, and as a result, such coating is worth applicable to an ornamental part for watches.

EXAMPLE 3

A watch case formed of SUS 303 material was sufficiently cleaned with acetone and then subjected to ion plating for 30 minutes by supplying an amount of nitrogen gas as defined by the sample 4 in Table 1. A coating thus obtained was excellent in luster and light yellow in color tone. Values measured by U.C.S. was L=19.7, a=2.1 and b=4.3. Both the luster and the color tone of the coating was entirely the same as those of a watch case plated with 14K to 18K gold. The coating had excellent scratch resistance and proved that it can satisfactorily be used as an ornamental article for watches.

EXAMPLE 4

The watch case in the example 2 was subjected to the following tests.
Salt water spray test as defined by JIS Z 2371.
Sweat immersion test:
  Salt 7 g/l
  Urea 1 g/l
  Lactic acid 4 ml/l
  Methanol 50 ml/l
Heat shock cycle test:
  Suddenly cooled from 200° C. with water for 10 minutes repeating 3 times.

The above tests have yielded the result that appearance of the coating is not changed at all.

EXAMPLE 5

An abrasion test effected on the plate formed of SUS 300 material and subjected to ion plating as described in Example 1. In the abrasion test, use was made of CS-10 wheel of an abrasion testing machine made by Taber Co. in U.S.A. under a load of 500 g. The abrasion test has yielded the result that a titanium nitride coating having a thickness of 1$\mu$ and produced by ion plating has a wear resistance which corresponds to a conventional gold coating having a thickness of 100$\mu$ and produced on a watch case by gold electro plating.

In FIG. 3, the vacuum chamber 11 was evacuated through the exhaust conduit to vacuum lower than $3\times10^{-5}$ Torr, the substrate 15 such as a watch case was supported by the cathode 14. Argon gas was introduced through the needle valve 13 into the vacuum chamber 11 to maintain a reduced pressure of $2\times10^{-2}$ Torr. To the cathode 14 was applied a direct current voltage of −800 V. The electric source 21 was adjusted such that the thermionic filament 20 was heated to 2500° C. The filament 20 was biased to −1 KV with respect to ground by the direct current source 22. From the evaporation source 16 controlled by the electric source 18 was evaporated metal titanium to form on the substrate 15 a metal titanium coating at a grow speed of 0.3 $\mu$/min. A discharge which is blue in color was observed through a peeping window provided at the side of the vacuum chamber 11.

Under the above described condition, the amount of Argon gas to be introduced into the vacuum chamber 11 was gradually decreased, while a nitrogen gas was gradually introduced through a needle valve 13' into the vacuum chamber 11 to maintain an overall reduced pressure in the vacuum chamber 11 under $3\times10^{-3}$ Torr. Then, ion plating was effected for 5 minutes. A titanium nitride coating having an excellent luster was formed on th substrate surface. Where the amount of nitrogen gas introuced is increased and the amount of titanium evaporated is decreased, the coating becomes dark golden color. On the contrary, where the amount of nitrogen gas introduced is decreased and the amount of titanium evaporated is increased, the coating becomes bright golden color.

It is found out that the above mentioned control of color tone can easily be effected, that difference between parts obtained by ion platings effected for 10 times could not be observed by a color difference meter or by naked eyes and that ion plating is highly precise in repetition for color tone.

Heat shock tests effected for 10 cycles, one cycle comprising immersing a titanium nitride coating formed by ion plating according to the invention in nitrogen liquid for 5 minutes and immersing the same coating in boiling water for 5 minutes, have yielded the result that the coating is not flaked off the substrate even when it is composed of brass, steel, aluminium or zinc.

Even when the coating was immersed in 5% $HNO_3$ solution for 3 days, color tone was not changed and no corrosion occurred. Microvickers hardness meter measurement has yielded the result that the coating had a hardness $Hv=800$ under a load of 25 g and that the coating was difficult to be flaked off the substrate and had a plenty of fashionable color tones.

In the previous example, use was made of an ion plating apparatus which makes use of direct current voltage and a thermionic source. Alternatively, any other radio frequency excitation apparatus and cluster beam ion plating apparatus which can produce a metal titanium coating and a titanium nitride coating by ion plating may also be used.

Figure 10:
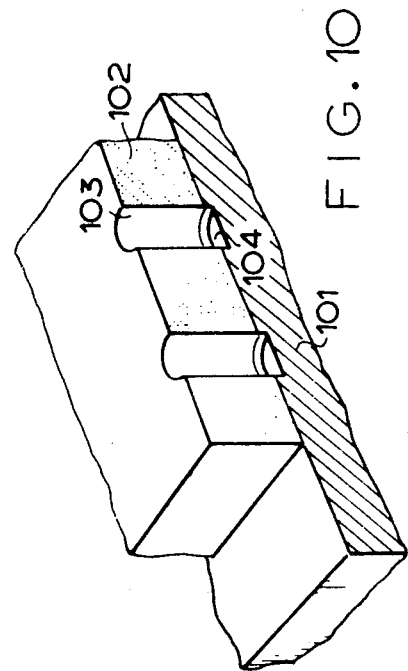
FIG. 10 is an enlarged perspective view showing partly in section a conventional ornamental part composed of a stainless steel substrate covered with a titanium nitride coating.

In FIG. 10 is shown a conventional ornamental stainless steel part covered with a titanium nitride coating in an enlarged scale. A stainless steel substrate 101 is formed of SUS 303, 304 material. Prior to ion plating, the stainless steel 101 is subjected to ion bombardment to remove an oxide coating from the surface thereof and expose an activated surface 104 on which is formed a titanium nitride coating 102. The titanium nitride coating 102 includes pinholes 103 scattered therein and through which is exposed the activated surface 104 of the stainless steel substrate 101. An electric potential produced in the titanium nitride coating 102 is slightly higher than that produced in the stainless steel substrate 101, so that there is a difficult problem that the titanium nitride coating 102 is electrically corroded.

Figure 11:
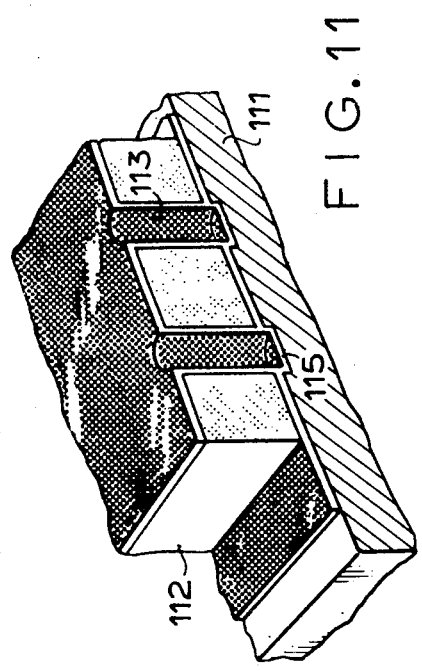
FIG. 11 is an enlarged perspective view showing partly in section an ornamental part composed of a stainless steel substrate covered with a titanium nitride coating and treated with the chromic acid according to the invention.

In FIG. 11 is shown an ornamental stainless steel part covered with a titanium nitride coating according to the invention in an enlarged scale. On a stainless steel substrate 111 is formed a titanium nitride coating 112 by ion plating. In the case of forming the titanium nitride coating 112 on the stainless steel substrate 111 by ion plating, pinholes 113 are produced and scattered on the coating 112 depending on conditions under which is formed the coating 112. During ion plating, the substrate 111 is subjected to ion bombardment in glow discharge to form the titanium nitride coating 112 thereon which is formed only when coating components are adhered to the substrate 111 at a speed which is higher than a sputtering speed due to the ion bombardment.

The pinholes 113 where the coating 112 is not formed are subjected to sputter etching effect only by ion bombardment during glow discharge. As a result, the passivated coating is removed from the substrate surface to expose the activated surface. The activated surface portions are required to be passivated. In the case of forming the coating 112, in the first place, the substrate 111 is immersed in at least one acid selected from the group consisting of hydrochloric acid, sulfuric acid and fluoric acid to clean the activated surface and then is treated with 5% potassium bichromate and 5% nitric acid at 70° to 80° C. for 30 to 60 minutes so as to effect passivation. Subsequently, the substrate 111 is sufficiently washed with hot water and cold water and then dried.

The above described way of treating the substrate 111 ensures passivation of the activation points 115 of the stainless steel in the pinhole 113 and of titanium of titanium nitride and hence sufficient protection of inner parts of the substrate 111.

It is formed out that a potential difference between the stainless steel substrate 111 formed of SUS 303 material and the titanium nitride coating 112 formed by ion plating is about 200 mV when the substrate 111 is not treated with chromic acid and that the potential difference becomes about 100 mV when the substrate 111 is treated with chromic acid. In general, it has been well known to heat stainless steel with chromic acid for the purpose of passivating the stainless steel. It is true that even if a stainless steel substrate covered with any other metal coating is treated with chromic acid. The coating could not precisely be reproduced and is not always corrosion resistant. This is because of the fact that in the case of effecting the chromic acid treatment an unstable oxide coating formed on the stainless steel substrate is not removed.

The invention is based on such reproduction and provides a successive way of forming a passivated coating having an excellent corrosion resistance on a stainless steel substrate in a good reproducible manner by completely removing an oxide film from the substrate and then treating it with chromic acid.

EXAMPLE 6

On an ornamental part for watches was formed a titanium nitride coating having a thickness of 0.5 $\mu$ by ion plating. Then, the coating was subjected to alkaline electrolysis to remove grease from the coating surface so as to make clean pinholes therein. Subsequently, the article was immersed in 50% hydrochloric acid and then washed with water and treated with 5% potassium bichromate liquid at 70° to 80° C. for 30 minutes.

After the chromic acid treatment, the part was washed with hot water and cold water and dried. p Corrosion resistance tests inclusive of sweat immersion test at 35° C. for 96 hours and salt water spray test at 35° C. for 96 hours have demonstrated the result that the coating has no corroded points. In the sweat immersion test, use was made of synthetic sweat comprising 9.9 g/l of sodium chloride, 0.8 g/l of sodium sulfide, 1.7 g/l of urea, 0.2 cc/l of ammonia water and 1.7 cc/l of lactic acid.

EXAMPLE 7

An ornamental rear lid for watches secured to a watch case by screws and formed of SUS 304 material was covered with a titanium nitride coating having a thickness of 0.5 $\mu$ by ion plating. The lid was rinsed with a conventional alkaline electrolytic degreasing liquid so as to remove grease from its surface, pinhole portions and threadedly engaged portions. Then, the lid was immersed into a mixed liquid consisting of 5 vol. % of hydrochloric acid, 5 vol. % of sufluric acid and 5 vol. % of fluoric acid to remove unstable oxide film. Subsequently, the lid was treated with a mixed liquid consisting of 5 wt. % of potassium bichromate and 5 vol. % of nitric acid at 70° to 80° C. for 30 minutes. Then, the lid was washed with hot and cold water and subjected to corrosion resistance tests.

Sweat immersion tests and salt water spray tests have shown the result that no rust occurs on the lid and the lid has excellent corrosion resistance.

As seen from the above, the invention provides an ornamental stainless steel part for watches covered with a titanium nitride coating having excellent corrosion resistance. The invention provides a way of covering on a stainless steel substrate with a titanium nitride coating having excellent appearance, scratch resistance, corrosion resistance and adherence as well as having golden color tone, said coating being widely applied to many fields in the case of providing a novel ornamental part for miscellaneous articles.

A plurality of watch cases each formed of stainless steel and comprising a bezel, case, winding crown incorporated therein were supported by the cathode 14 shown in FIG. 3. The vacuum chamber 11 was evacuated to a reduced pressure of $5 \times 10^{-3}$ Torr and nitrogen gas was introduced through the needle valve 13 into the vacuum chamber 11 to maintain an atmosphere under a pressure of $2 \times 10^{-2}$ Torr. Use was made of a resistor heating boat, electron beam etc. as the evaporation source 16 and titanium was evaporated therefrom.

Between the evaporation source 16 and the cathode 14 was applied a direct current voltage of $-500$ to $-1000$ V to generate glow discharge by means of nitrogen gas and titanium vapor. The ornamental part 15 for watches comprising bezel, case, etc. incorporated therein was subjected to ion plating for 10 minutes. A titanium nitride coating having a thickness about 3 $\mu$ was formed on the part. The coating thus formed had luster and color tone based on golden color. In FIG. 3 reference numeral 17 designates a direct current source, 18 an electric source for the evaporation souce 16 and 19 an insulating material. If a plurality of parts 15 are supported by the cathode 14 and arranged side by side, it is possible to continuously change the color tone of the titanium nitride coating and obtain the parts 15 which are considerably different in design from each other. In addition, the vacuum chamber 11 is kept under a relatively high pressure of $2 \times 10^{-2}$ Torr, so that any gap formed between those parts which are assembled with each other may be covered with the coating thus giving good appearance.

As described above, if a plurality of parts 15 supported by the cathode 14 and assembled in predetermined condition are subjected to ion plating, number of articles to be treated in the vacuum chamber 11 can be increased thus rendering it possible to reduce the running cost of the vacuum chamber 11 and provide articles which are far cheaper than those covered with coatings formed by conventional gold electro plating.

The invention is capable of increasing treating capacity per unit vacuum chamber 3 to 5 times larger than when one part for watches is supported by one cathode.

A watch case, rear lid, battery lid and adjustable screw lid each formed of SUS 304 material were assembled together and the assembly was supported by the cathode 14 shown in FIG. 3. The vacuum chamber 11 was exhausted to a reduced pressure of $2 \times 10^{-2}$ Torr. Titanium was evaporated from the resistor boat evaporation source 16 to the cathode 14 was applied a direct current voltage of $-500$ V. A titanium nitride coating formed on the assembly of parts had a thickness of 4 $\mu$ and golden color tone.

Tests of carrying parts for one month have yielded the result that 4 scratches per 10 mm$^2$ occur on a watch case wet plated by gold in a conventional manner, that only 1 scratch per 20 mm$^2$ becomes visible on a watch case covered with a titanium nitride coating according to the invention and that the titanium nitride coating has a hardness which prevents the coating from being cracked and gives excellent wear resistance thereto.

The titanium nitride coating had a hardness of $Hv = 800$ when measured by microvickers hardness meter under a load of 25 g. The hardness of the coating was 2.5 times higher than a hardness $Hv = 300$ of stainless steel constituting the substrate.

In the present example, use was made of ion plating for applying a high direct current voltage, so called MATTOX type. The same or substantially the same result as that of the present example may be obtained by using other ion platings such as a high frequency excitation ion plating and thermionic emission plating, for example, multiple cathode ion plating.

A watch case formed of brass and aluminum was machine worked and then the case was supported by a jig which also functions as the cathode. Oxygen is introduced through the needle valve into the vacuum chamber to maintain a partial oxygen presure of $2 \times 10^{-2}$ Torr therein. To the jig was applied a direct current of $-0.5$ KV and the case was subjected to ion plating with nickel for 2 minutes. Then, the oxygen partial pressure was raised to $8 \times 10^{-2}$ Torr and the direct current voltage applied to the jig was increased to $-1$ KV to effect ion plating for about 8 minutes. Then, the introduction of the oxygen gas was stopped. Nitrogen gas was introduced through another needle valve into the vacuum chamber to maintain a reduced pressure of $5 \times 10^{-3}$ Torr. Titanium was evaporated from the evaporation source to effect ion plating. A cause thus obtained had a golden color tone in appearance.

The case had a hardness $Hv = 600$ measured by a microvickers hardness tester. Even when the case was immersed into 10% HNO$_3$ solution at room temperature for 3 days, no corrosion, discoloration, etc. occurs. The case was chemically stable and had fashionable appearance. In order to provide an electrochemically stable case part, it is preferable to provide a metal coating forming of Ti, Ta, Cr, etc. and sandwich between a case part formed by brass and aluminum and a Ni coating and use a Ni-Co alloy instead of the Ni coating which constitutes a passivated coating.

A stainless steel watch case was covered with a titanium nitride coating having a thickness of 3 to 5 $\mu$ by sputtering or ion plating. Then, the case was introduced into an electric furnace and heat treated in air at 300° C. for 1 hour. Slight difference between conditions for forming the coating resulted in different color tones on respective cases. The coating had unstable property and was liable to be flaked off the substrate in wet absorbing atmosphere. But, the coating after heat treatment showed a golden color similar to that of gold and coatings on respective cases had no difference in color tone if compared with each other. In addition, the coating had remarkably improved adherence. No flake off was revealed in wet absorbing atmosphere by heat cycle tests continuously effected for 10 times at a changeable temperature from $-40°$ C. to room temperature and then to $+80°$ C. The optimum heat treatment condition becomes different depending on the thickness of the titanium nitride coating. A coating having a thickness thinner than 3 $\mu$ is required to be heat-treated at a low temperature of 250° C. for a short time of 30 minutes. A coating having a thickness thicker than 5 $\mu$ is required to be heat-treated at a high temperature of 450° C. for a long time of 2 hours.

In the examples described above, use was made of the stainless steel substrate. The invention may also be applied to a substrate formed of a metal or its alloy selected from the group consisting of brass, aluminium alloy, iron alloy and nickel coated brass.

Heat treatment must be carried out under such conditions that the golden color which is metal luster shown by the original coating is not degraded, that the hardness of the coating is not deteriorated and that the adherence of the coating is improved.

It is preferable to carry out the heat treatment at a temperature of 250° C. to 600° C. If the heat treatment is effected at a temperature lower than 250° C., stress exerted to the coating is not sufficiently removed. If the heat treatment is effected at a temperature higher than 600° C., the initial golden color becomes more or less disappeared.

EXAMPLE 8

A watch case formed of stainless steel was subjected to a final finish buffing to provide a beautiful surface having luster. A titanium nitride coating having a thickness of 5 $\mu$ was formed thereon by ion plating. The surface of the coating thus obtained was remained as the luster of the substrate metal and had beautiful golden color. In order to improve adherence of the coating, it was heat treated in vacuum under a pressure of $2 \times 10^{-5}$ Torr to $6 \times 10^{-6}$ Torr at 400° C. for 1.5 hours. The surface condition of the coating after the heat treatment permitted to remain the lustrous golden color which was obtained by ion plating.

After completion of the heat treatment, corrosion resistance test, bending test, shock resistance test etc. were effected on the watch case. These tests have yielded the result that no abnormal defects such as corrosion, discoloration, etc. were occurred on the coating. As the corrosion resistance test, salt water spray test was effected by using 5% salt water at 35° C. for 96 hours and sweat immersion test was effected at 35° C. for 96 hours.

In the present example, the watch case was formed of stainless steel. The same result may be obtained by heat treating on a watch case formed of brass, German silver, etc.

In FIG. 8 is shown a multiple cathode ion plating apparatus. A vacuum chamber 91 was evacuated through an exhaust pipe 92 and then a nitrogen gas was introduced through an inlet pipe 93 into the vacuum chamber 91 to maintain a reduced pressure of $1 \times 10^{-2}$ Torr. A filament 94, its electric source F and an electric source A for ion discharge was operated to produce a discharge plasma in the vacuum chamber 91. To a substrate 97 formed of SUS 304 stainless steel watch case was applied $-200$ V and then an evaporation source 95 and its electric source B were operated to evaporate titanium at a coating growing speed of 20 Å/sec thus effecting reactive ion plating for 30 minutes. The watch case thus obtained exhibited noble yellow color which is light yellow. The watch case withstood against for 48 hours and synthetic sweat immersion test for 48 hours. The watch case also withstood against the heat cycle test effected for 20 times each time the watch case was quickly cooled from 300° C. to room temperature. In addition, the watch case showed no crack and flaking off failure even when it was bent at an angle of about 15°. The coating had a thickness of 32 $\mu$, a hardness of 1120 MHV and a weight ratio of titanium to titanium nitride was 4:6.

In the present example, use was made of the multiple cathode reactive plating. In general, it is possible to obtain a coating formed of a mixture of titanium and titanium nitride, under constant strength of the discharge plasma and vacuum degree by decreasing the amount of nitrogen gas which is one of reaction carriers to be introduced into the vacuum chamber 91 and by increasing the concentration of titanium which is the other reaction carrier. The ratio of titanium to titanium nitride may be changed from 0.01 to 100 by increasing and decreasing the concentration of titanium, that is, the vaporation speed thereof provided the other conditions are constant.

In general, if the ratio of titanium to titanium nitride is changed, physical properties of the coating become changed. The ratio causes the physical property of the coating to approach to that of a coating formed of each of respective elements. This change in physical properties is substantially continuously effected.

For example, if the amount of titanium is increased, the coating is improved in its toughness and shows light noble golden color to white color in color tone. On the contrary, if the amount of titanium nitride is increased, the coating has a high hardness and becomes brittle, the color tone being changed from golden color into dark yellow brown color. It is preferable that the above mentioned ratio of titanium to titanium nitride is 3.0 to 0.2 for the purpose of obtaining color tone which satisfies the object of the invention.

In general, a coating formed by ion plating is not limited to a titanium nitride coating, that is, a TiN coating only, but might include $TiN_{(1-x)}$ coatings or $TiN_{(1+x)}$ coatings. It should be understood that in the $TiN_{(1-)}$ coating $1 > x$ and preferably $0.5 > x$.

In the present example, use was made of the watch case formed of SUS 304 stainless steel. The invention may also be applied to a substrate formed of austenite system stainless steel and substrates in general, if a thick coating is formed thereon, for example, a substrate formed of copper alloy.

In the mixture coating consisting of titanium and titanium nitride, titanium functions as a binder to improve the physical properties and color tone of the coating. As a result, such mixture coating can obviate the disadvantage of coatings formed by the prior art techniques and may be used in practice as a surface treated coating for ornamental parts having golden color which requires high quality. The invention may be applied not only to ornamental parts for watches but also to corrosion resistant parts as well as to any parts for articles in other wide fields.

In FIG. 9 is shown a hot cathode discharge ion plating apparatus. In the present example, a vacuum chamber 91 was evacuated through an exhaust pipe 92 and then a nitrogen gas was introduced through an inlet pipe 93 into the vacuum chamber 91 to maintain a reduced pressure of $2 \times 10^{-4}$ Torr. A hot cathode 96, its electric source, anode 95 and its electric source were operated to generate a discharge plasma in the vacuum chamber 91. To a substrate 97 composed of a brass watch case whose surface has been cleaned by bombardment was applied an electric field of $-200$ V. Then, an evaporation source 95 and its electric source were operated to effect ion plating of Ti at a coating forming speed of 30 Å/sec for 6 minutes. The amount of nitrogen gas introduced through the inlet pipe 93 into the vacuum chamber 91 was increased to maintain a reduced pressure of $3\times10^{-3}$ Torr. Then, reactive ion plating was effected at a coating forming speed of 10 Å/sec for about 25 minutes. The watch case thus treated had bright golden color and withstood against corrosion resistance tests inclusive of salt water spray tests for 48 hours and synthetic sweat immersion test for 48 hours. Heat cycle tests effected for 20 times each quickly cooling the watch case from 300° C. to room temperature have yielded the result that no separation occurs between the substrate and the coating and between the two coatings. In addition, abrasion tests with the aid of Taber Co. abrasion testing machine have shown the result that no abrasion scratch occurs even after 1000 tests. Practical carrying tests for about half one year have demonstrated the result that luster in appearance was not deteriorated due to abrasion scratches.

The surface treated coating formed on the watch case was composed of a first titanium coating formed on the substrate and having a thickness of 10 μ and a second yellow titanium nitride coating having a thickness of 1 μ.

As demonstrated by the examples, the golden ornamental part according to the invention exhibits greatly enhanced corrosion resistance and adherence and in particular provides hard wear resistant ornamental part which has been difficult to obtain by conventional gold electro plating.

The reasons why the properties of the ornamental part are improved are as follows. The titanium nitride coating formed by conventional techniques is hard and brittle, so that the coating could not firmly be adhered to a substrate formed of different kind of material. On the contrary, the present invention makes use of an intermediate coating formed of titanium which is the same in kind of element as a surface coating by ion plating, thereby improving adherence of the surface coating to the substrate. In addition, the improvement in corrosion resistance is presently believed to be due to the presence of the titanium intermediate coating having a large thickness serving to supplement the thin thickness of the surface coating which has been difficult to make thick. The invention also makes use of ion plating which is less expensive and in particular the use of one evaporation source which functions to evaporate metal titanium ensures a simple process which can change the evaporation speed and the amount of nitrogen gas to be introduced. In addition, the intermediate titanium coating can rapidly be formed under vacuum of $2\times10^{-4}$ Torr, whereby the coating becomes large in thickness within a short time thus significantly reducing treating cost. As described in the examples, the titanium coating is formed by ion plating in nitrogen gas atmosphere, so that it is believed that the titanium coating contains titanium nitride. But, such kind of titanium nitride is a lower class nitride under conditions defined in the examples. As a result, it is possible to consider that the intermediate coating substantially as a whole is composed of titanium. Noble gas such as argon etc. may be used instead of nitrogen gas.

In the hot cathode discharge ion plating, the discharge plasma is suitable for attaining the object of the invention with regard to distribution and strength of the plasma. The similar effect may also be obtained by other ion platings.

In the above described examples, the use was made of a brass watch case as a substrate. The invention may also be aplied to austenite system stainless steel substrate having superior corrosion resistance and, to all of generally used ornamental substrates.

In the above described examples, the intermediate titanium coating had a thickness of 10μ and the surface titanium nitride coating had a thickness of 1μ. In the present invention, use may be made of an intermediate titanium coating having a thickness of 1 to 100μ and surface titanium nitride coating having a thickness of 0.1 to 10μ. However, by taking the treating costs and surface luster into consideration, in practice, it is preferable to use an intermediate titanium coating having a thickness of 1 to 20μ and a surface titanium nitride coating having a thickness of 0.2 to 1μ.

The invention provides a golden ornamental part without using an expensive gold electro plating in a less expensive manner. In addition, the invention renders it possible to provide a hard corrosion resistant case which has never been obtained by conventional golden ornamental parts. The invention provides a novel technique of practically accomplishing plating without involving any public pollution thus contributing greatly in industry. The technique according to the invention may be applied not only to the ornamental field but also to many other fields inclusive parts having wear resistance.

In the hot cathode discharge ion plating apparatus shown in FIG. 9, the vacuum chamber 91 was evacuated through the exhaust pipe 92 and then nitrogen gas was introduced through this inlet pipe 93 into the vacuum chamber 91 to maintain a reduced pressure of $5\times10^{-3}$ Torr. The hot cathode 96, its electric source, anode 95 and its electric source were operated to generate the hot cathode discharge plasma in the vacuum chamber 91. The temperature was controlled so that it does not exceed 400° C. To the substrate 97 composed of a watch case formed of SUS 304 stainless steel was applied an electric field of $-300$ V and then an evaporation source 95 and its electric source B were operated to evaporate titanium at a coating forming speed of 12 Å/sec. Reactive ion plating was effected for about 20 minutes. A current density of the substrate 97 was 4 mA/cm². The watch case constituting the substrate 97 had golden color and withstood against corrosion resistance tests inclusive of salt water spray tests for 48 hours and synthetic sweat immersion tests for 48 hours without producing any rust. Heat cycle tests effected for 20 cycles each quickly cooling the substrate 97 from 300° C. to room temperature yielded the result that no separation failure occurs. The coating thus formed had a thickness of 0.9 μ and a surface hardness of 1340 MHV. Electron diffraction analysis of TiN showed that an average crystal particle diameter was 110 Å.

The reactive ion plating described in the present example is a process which makes use of Langmure mode hot cathode discharge plasma, that is, so-called glow plasma. In this process, the average crystal particle diameter becomes fine due mainly to the substrate temperature, substrate current density and coating forming speed under constant plasma strength and degree of vacuum. The use of such three kinds of factors as defined in the previous example ensures obtaining an average crystal particle diameter of 110 Å.

In the present example, use was made of the hot cathode discharge process as the reactive ion plating. In principle, any other reactive ion platings may also be used by defining conditions thereof for the purpose of making the crystal extremely fine.

The coating had the average crystal particle diameter of 110 Å. But, if the above described three main conditions are controlled, it is possible to obtain a titanium nitride coating whose particle diameter lies within a range between 380 Å and 80 Å. However, it is preferable to produce a coating having a particle diameter of smaller than 150 Å in view of obtaining beautiful luster.

The watch case was formed of SUS 304 stainless steel as the substrate. The invention may also be applied to austenite system stainless steel substrate having excellent corrosion resistance and to any other materials having excellent corrosion resistance.

In the titanium nitride coating according to the invention, fine crystallization of titanium nitride causes the coating to improve its luster and toughness. This eliminates a difficult problem which has been encountered with the case of practically using a golden ornamental parts and in particular using a high class ornamental part obtained by conventional ion plating surface treating processes.

What is claimed is:

1. An ornamental part for watches comprising a substrate and a composite coating essentially consisting of titanium nitride and titanium formed by physical vapor deposition, said coating including an amount of titanium which continuously decreases from the portion adjacent said substrate to the surface thereof wherein said coating has a color tone with a brightness value of from 10 to 22 for a mirror surface test piece defined by a color difference measuring unichromatic system, with a ratio of red color to green color of from −5 to +5 and with a ratio of a yellow hue to blue color of from 0 to +5.

2. The ornamental part for watches according to claim 1, wherein the ratio of titanium to titanium nitride in said coating layer is about 100:1 to 1:1 in a portion adjacent to said substrate and about 1.1 to 1:100 in the outer surface portion.

3. The ornamental part for watches according to claim 1, wherein the ratio of titanium to titanium nitride in said coating layer is about 3:1 to 1:1 in a portion adjacent to said substrate, and about 1:1 to 1.5 in the outer surface portion.

4. The ornamental part for watches according to claim 4, wherein said substrate is composed of any one of brass, a copper alloy containing nickel silver, aluminum and aluminum alloy, a ferro-alloy containing stainless steel, ceramics, or plastics having a thermal deformation temperature of higher than 150° C.

5. The ornamental part for watches according to claim 3, wherein an oxide layer which had been formed already on the surface of said substrate is present between said substrate and said coating layer.

6. The ornamental part for watches according to claim 3, wherein an inter-diffusion region is present between said substrate and said coating layer.

7. The ornamental part for watches comprising a substrate and a coating layer containing titanium nitride represented by TiNx and formed by the physical vapor deposition method, the value of said x ranges from 0 to about 0.5 in a portion closest to said substrate, and lying over a range of from about 0.5 to 1 in the outer surface portion wherein said coating has a color tone with a brightness value of from 10 to 22 for a mirror surface test piece defined by a color difference measuring unichromatic system, with a ratio of red color to green color of from −5 to +5 and with a ratio of a yellow hue to blue color of from 0 to +5.

8. In the method of forming a coating essentially consisting of titanium nitride and titanium on the surface of a substrate by the physical vapor deposition method, a method of producing an ornamental part for watches comprising;
   evaporating titanium from a source of evaporation at a substrate temperature ranging from about 100° to about 300° under the condition in which a voltage sufficient for producing glow discharge is applied across said substrate and said source of evaporation placed in a vacuum vessel;
   feeding a nitrogen gas into said vacuum vessel; and
   changing a ratio of the partial pressure of titanium vapor to the partial pressure of said nitrogen gas in said vacuum vessel depending upon the progress of the vaporization, such that the ratio of titanium to titanium nitride contained in the resulting coating continuously decreases from the portion closest to said substrate toward the outer surface.

9. The method according to claim 8, wherein said substrate is composed of any one of brass, a copper alloy containing nickel silver, aluminum and aluminum alloy, a ferro-alloy, ceramics or plastics having a thermal deformation temperature of greater than 150° C.

10. The method according to claim 8, wherein said substrate has an oxide layer on the surface thereof, and said coating is formed on said oxide layer.

11. The method according to claim 8, wherein the ratio of the partial pressure of titanium vapor to the partial pressure of nitrogen gas in said vacuum container, is so controlled that the ratio of titanium to titanium nitride in said coating is about 100:1 to 1:1 in a portion closest to the substrate and 1:1 to 1:100 on the outer surface.

12. The method according to claim 8, wherein the ratio of the partial pressure of titanium vapor to the partial pressure of nitrogen gas in said vacuum vessel, is so controlled that the ratio of titanium to titanium nitride in said coating is about 3:1 to 1:1 in a portion closest to the substrate and about 1:1 to 1:5 on the outer surface.

13. The method according to claim 8, including a step for changing a potential differential between said substrate and said source of evaporation depending upon the progress of vaporization, such that there is formed a coating containing titanium nitride represented by TiNx, the value of x lying over a range of from 0 to about 0.5 in a portion of said coating closest to said substrate and lying over a range of from about 0.5 to 1 on the outer surface.

14. The method according to claim 8, wherein said titanium nitride is formed as crystals having the particle size up to 150 angstroms.

15. The method according to claim 14, wherein said titanium nitride crystals represent the highest peak at (200) orientation measured by the X-ray analysis.

16. The method according to claim 8, wherein after forming said coating said ornamental part is dipped in a liquid containing at least one of hydrochloric acid, sulfuric acid and hydrofluoric acid and then processed with a liquid containing chromic acid.

17. The method according to claim 8, wherein after forming said coating said ornamental part is subjected to a heat treatment at a temperature ranging from about 250° C. to about 600° C.

18. In a method of producing an ornamental part for watches for forming on a substrate a coating essentially consisting of titanium and titanium nitride by a physical vapor deposition method, the method of producing the ornamental part comprising:

placing the substrate in a vacuum vessel in which a voltage sufficient for producing a glow discharge is applied across the substrate and a source of evaporation;

feeding a nitrogen gas into the vacuum vessel; and controlling the ratio of the partial pressure of titanium vapor to the partial pressure of nitrogen in said vacuum vessel with the process of the deposition in such a manner that the ratio of titanium to titanium nitride in the resulting coating continuously decreases from the portion adjacent said substrate to the surface thereof;

the ratio of titanium to titanium nitride being from about 3:1 to 1:1 at a portion closest to said substrate and from about 1:1 to 1:5 at the outer surface of the coating; and said coating having a color tone with a brightness value of from 10 to 22 for a mirror surface test piece defined by a color difference measuring unichromatic system, with a ratio of red color to green color of from −5 to +5 and with a ratio of a yellow hue to blue color of from 0 to +5.

19. The method of claim 18 wherein the substrate temperature is in a range of from about 100° C. to about 300° C.

20. The method of claim 19 wherein the voltage is in a range of from 600V to 800 V.

* * * * *

UNITED STATES PATENT AND TRADEMARK OFFICE
CERTIFICATE OF CORRECTION

PATENT NO. : 4,226,082

DATED : October 7, 1980

INVENTOR(S) : Nobuo Nishida

It is certified that error appears in the above-identified patent and that said Letters Patent is hereby corrected as shown below:

Col. 21
Claim 4, line 2, change "4" to --3--.

Signed and Sealed this

Twenty-first Day of September, 1993

Attest:

BRUCE LEHMAN

Attesting Officer

Commissioner of Patents and Trademarks